(12) United States Patent
Ikegami et al.

(10) Patent No.: US 8,108,192 B2
(45) Date of Patent: Jan. 31, 2012

(54) SIMULATOR APPARATUS AND SIMULATION METHOD

(75) Inventors: Hideyuki Ikegami, Abiko (JP); Toru Ono, Toyota (JP); Masahiro Serizawa, Toride (JP); Akira Morisawa, Kashiwa (JP)

(73) Assignee: Canon Kabushiki Kaisha (JP)

( * ) Notice: Subject to any disclaimer, the term of this patent is extended or adjusted under 35 U.S.C. 154(b) by 857 days.

(21) Appl. No.: 11/755,892

(22) Filed: May 31, 2007

(65) Prior Publication Data

US 2007/0288218 A1    Dec. 13, 2007

(30) Foreign Application Priority Data

Jun. 7, 2006  (JP) .................................. 2006-159137

(51) Int. Cl.
*G06F 17/00* (2006.01)
*G06G 7/62* (2006.01)

(52) U.S. Cl. ............................................. 703/13; 703/7
(58) Field of Classification Search .................. 703/7, 13
See application file for complete search history.

(56) References Cited

U.S. PATENT DOCUMENTS

| 5,844,819 A | * | 12/1998 | Fujinuma .......................... 703/7 |
| 6,980,945 B2 | * | 12/2005 | Elias .................................. 703/17 |
| 2003/0078762 A1 | * | 4/2003 | Hashima et al. ................. 703/13 |
| 2005/0234695 A1 | * | 10/2005 | Wang et al. ...................... 703/19 |

FOREIGN PATENT DOCUMENTS

| JP | 5-143260 A | 6/1993 |
| JP | 05-290119 A | 11/1993 |
| JP | 07-271410 A | 10/1995 |
| JP | 9-081600 A | 3/1997 |
| JP | 10-261002 A | 9/1998 |
| JP | 2001-290857 A | 10/2001 |
| JP | 2003271215 A | 9/2003 |
| JP | 2004021904 A | 1/2004 |
| JP | 2006-139479 A | 6/2006 |

OTHER PUBLICATIONS

Office Action issued in corresponding Japanese Patent Application No. 2006-159137 dated Jun. 20, 2011.
Office Action issued in corresponding Japanese patent application No. 2006-159137, dated Nov. 25, 2011.

* cited by examiner

*Primary Examiner* — Kamini S Shah
*Assistant Examiner* — Suzanne Lo
(74) *Attorney, Agent, or Firm* — Rossi, Kimms & McDowell LLP (57) ABSTRACT

A simulator apparatus simulates a behavior of an image forming apparatus in order to verify the behavior. The simulator apparatus includes a computing unit that performs a simulation operation on the behavior of the image forming apparatus, and a selection unit that selects a simulation speed of the computing unit.

6 Claims, 11 Drawing Sheets

SIMULATOR APPARATUS AND SIMULATION METHOD

BACKGROUND OF THE INVENTION

1. Field of the Invention

The present invention relates to a simulation technique for support of the design of image forming apparatuses.

2. Description of the Related Art

Conventionally, conveyance of sheet-like materials is performed in many fields. For instance, with an image forming apparatus, conveyed material such as printing material is conveyed by a conveyance mechanism including a roller, a guide and the like. Control software is essential in conveying conveyed material. In many conveyance controls, conveyed material is rarely conveyed at a constant speed and in one direction. Normally, the conveying speeds of conveyed material are appropriately switched. For instance, when a sensor detects a position of a conveyed material, a conveyance control unit may stop the conveyed material at a predetermined position or may reverse a roller to invert the conveyance direction.

In addition, sales points of recent image forming apparatuses are many functions and high productivity. Accordingly, software for controlling image forming apparatuses is becoming increasingly complex, resulting in an increase in man-hours required for discovery, cause identification and correction of failures.

In such circumstances, there are more opportunities to use simulation techniques in the design of conveyance mechanisms. In Japanese Patent Laid-Open No. 9-81600, a system is proposed which detects potential defects in a conveyance mechanism by performing simulation operations on the behavior of conveyed material.

With the active use of mechanism simulations in every conceivable situation, demand is increasing for techniques to verify the correctness of software with such control mechanisms. With software verification, simulations of basic paper behavior or reproductions of irregular situations are essential. It is empirically known that design errors in software occur more often in areas that control irregular behavior than in areas that control basic behavior.

In Japanese Patent Laid-Open No. 5-143260, a design support method is proposed in which an input apparatus such as a keyboard causes printer control software to generate an external event such as turning a switch on or off, or opening or closing a cover.

In conventional simulators for software verification, the execution speed of a simulation is constant. This is considerably inconvenient, since execution speeds cannot be changed according to intended purposes.

For instance, when it is desired to execute a wide-range simulation in which operation is performed in various modes, using a higher simulation speed than normal will produce faster results and is therefore efficient. On the other hand, when it is desired to perform rigorous verification on a phenomenon in order to verify true characteristics thereof, the phenomenon may be analyzed with greater detail by reducing its relative simulation speed.

SUMMARY OF THE INVENTION

The present invention may be preferably realized with, for instance, a simulator apparatus that simulates a behavior of an image forming apparatus in order to verify its behavior. The simulator apparatus includes a computing unit that performs simulation operations on the behavior of an image forming apparatus, and a selection unit that selects a simulation speed of the computing unit.

Further features of the present invention will become apparent from the following description of exemplary embodiments (with reference to the attached drawings).

DESCRIPTION OF THE EMBODIMENTS

An embodiment of the present invention will be described below. It will be obvious to those skilled in the art that the individual embodiments described below may prove useful towards understanding various concepts related to the present invention, including superordinate concepts, mid-level concepts and subordinate concepts thereof. In addition, it should be understood that the technical scope of the present invention is not limited by the individual embodiments described below, but is as defined by the claims.

Figure 1:
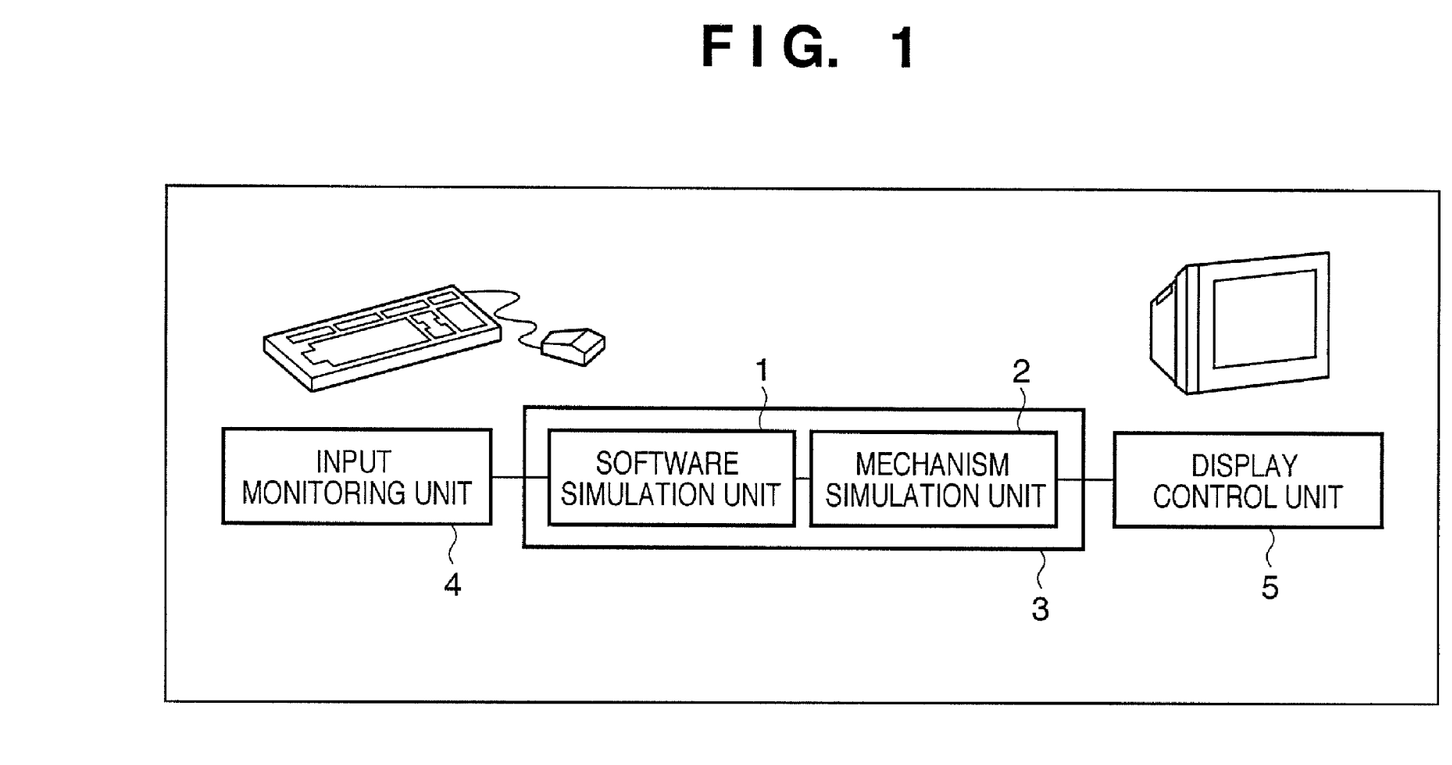
FIG. 1 is a diagram showing an outline of a simulator apparatus according to an embodiment.

FIG. 1 is a diagram showing an outline of a simulator apparatus according to an embodiment. The simulator apparatus is capable of functioning as a design support apparatus by executing a simulation of paper conveyance and the like of an image forming apparatus. The simulator apparatus may be realized, for instance, by a personal computer (PC) and a simulation program, or by a dedicated logic circuit (which may be partially realized by software). Such a simulator apparatus may be useful when designing control timings in firm software (firmware) that controls a real-life image forming apparatus.

A software simulation unit 1 is a function module that, for instance, virtually executes firm software intended for paper conveyance control on a PC. The software simulation unit 1 hands over the software simulation execution results to a mechanism simulation unit 2.

The software simulation unit 1 and the mechanism simulation unit 2 configure a simulation computing unit 3. The simulation computing unit 3 executes operations according to various selected simulation speeds (simulation modes). Two or more simulation modes such as a high-speed mode or a normal (low-speed) mode would suffice. In addition, the simulation computing unit 3 may relatively increase the operation accuracy when the simulation speed is relatively slow. The simulation computing unit 3 may be called as a simulation calculation unit.

The mechanism simulation unit 2 is a function module that calculates, for instance, in which portion of a paper conveyance mechanism a sheet of paper exists from the speed of a roller related to paper conveyance control. The mechanism simulation unit 2 hands over the calculation results to either the software simulation unit 1 or a display control unit 5.

An input monitoring unit 4 is a function module that monitors input from a man-machine interface (for instance, a keyboard device or a mouse). When a signal signifying commencement of a software simulation execution is input, the input monitoring unit 4 instructs the software simulation unit 1 to commence execution. In addition, the input monitoring unit 4 and the man-machine interface function as means for selecting the simulation speed (simulation mode) of the simulation computing unit 3. The input monitoring unit 4 may be arranged to receive input for selecting a simulation speed even before or during execution of a simulation operation by the simulation computing unit 3.

The display control unit 5 is a function module that causes, for instance, a paper conveyance simulation window or the like to be displayed on a display apparatus such as a display attached to a PC. The display control unit 5 may cause a window for selecting a simulation speed to be displayed on the display apparatus. This window may include a text box for designating one or more timings at which switching of simulation speeds are performed. In addition, the window may include buttons or the like for designating a simulation speed or simulation mode corresponding to the designated timing.

The respective function modules such as the software simulation unit 1 and the mechanism simulation unit 2 according to the present embodiment may also be realized as software modules. Prior to execution, these software modules are stored in a storage device (e.g., an HDD) of the PC. Upon execution, the software modules are deployed on a RAM of the PC and executed by a CPU.

Figure 2:
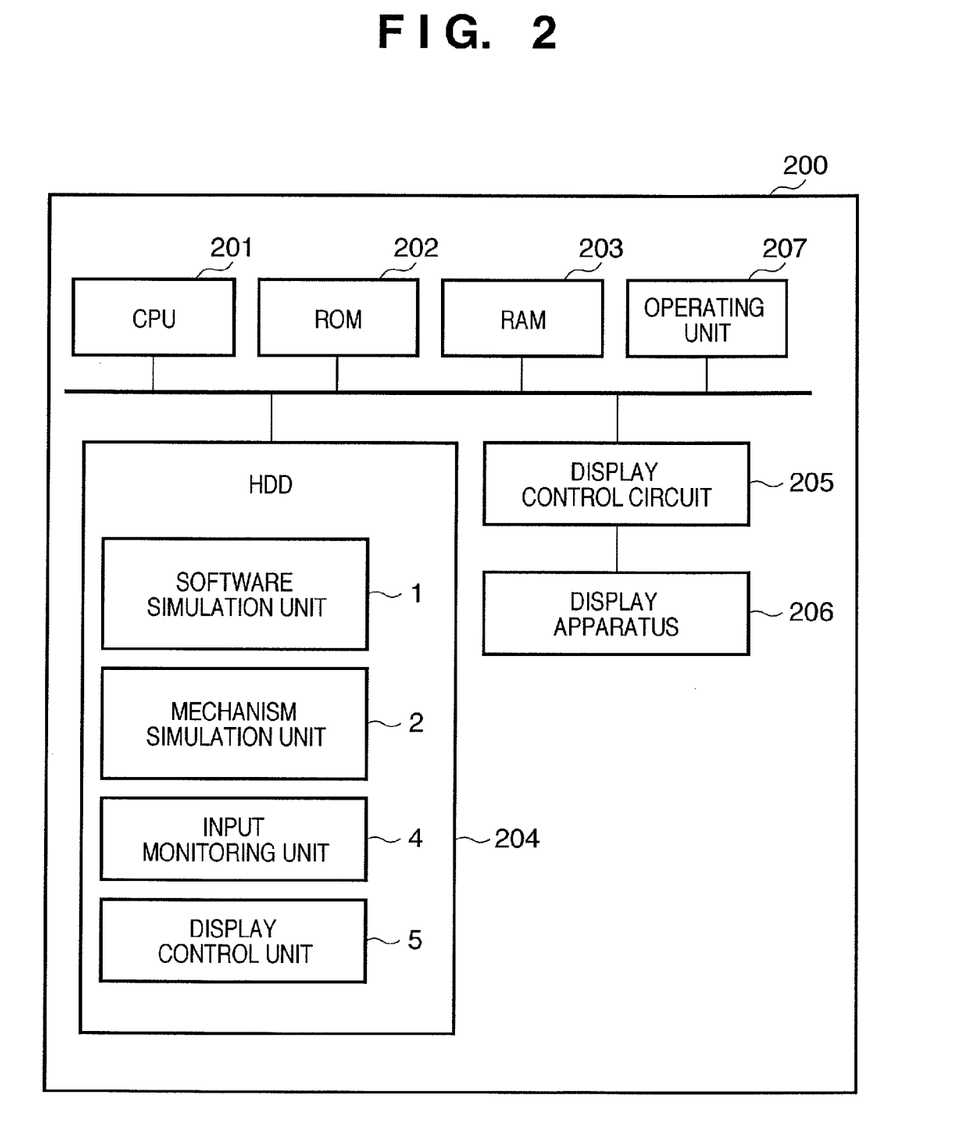
FIG. 2 is a block diagram showing an example of a simulator apparatus according to the embodiment.

FIG. 2 is a block diagram showing an example of a simulator apparatus according to the present embodiment. A CPU 201 is a control unit that performs overall control of the respective units of the computer based on a computer program. A ROM 202 is a non-volatile storage unit that stores control programs such as the firmware of the PC. A RAM 203 is a volatile storage unit that functions as a work area. A hard disk drive (HDD) 204 is a large-capacity storage unit. The HDD 204 may be arranged to store the software simulation unit 1, the mechanism simulation unit 2, the input monitoring unit 4 and the display control unit 5 that are realized as software modules. In reality, not the functions themselves but program code that realizes the respective functions is stored in the HDD 204. In addition, the HDD 204 stores various data necessary for simulating conveyance control of the image forming apparatus. Such data may include: lengths, shapes and positions of conveyance paths; positions of conveyance rollers, flappers and sheet sensors; and the relationships between a power source (e.g., motor) and the respective mechanisms.

A display control circuit 205 is a so-called graphics card, and outputs signals for display by a display apparatus 206 based on instructions from the display control unit 5. The display apparatus 206 is a display unit that displays various information to a user. An operating unit 207 is an input unit such as a pointing device or a keyboard.

Figure 3:
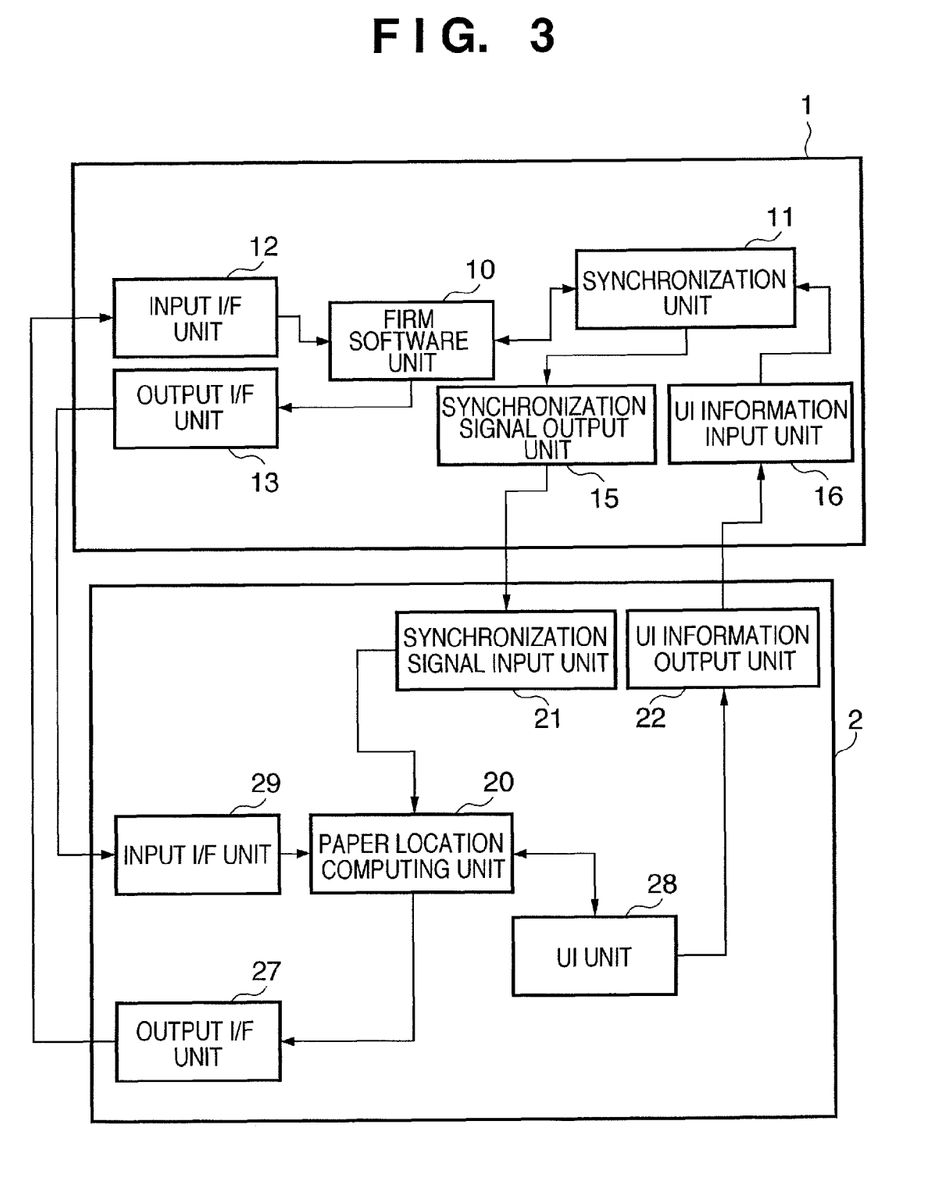
FIG. 3 is a block diagram showing examples of a software simulation unit and a mechanism simulation unit according to the embodiment.

FIG. 3 is a block diagram showing an example of a software simulation unit and a mechanism simulation unit according to the present embodiment. The respective blocks are either realized as software modules or hardware modules, or by collaboration between a software module and a hardware module.

The software simulation unit 1 comprises: a firmware unit 10; a synchronization unit 11; an input I/F unit 12; an output I/F unit 13; a synchronization signal output unit 15; and a UI information input unit 16. The firmware unit 10 is software itself that performs paper conveyance control in a real-life image forming apparatus. The synchronization unit 11 is a module that executes processing for moving simulation time forward while performing synchronization according to the state of the firmware unit 10.

The input I/F unit 12 is an interface for inputting information from the mechanism simulation unit 2. The output I/F unit 13 is an interface for outputting information to the mechanism simulation unit 2. The synchronization signal output unit 15 is an interface for outputting synchronization signals created by the synchronization unit 11 to the mechanism simulation unit 2. The UI information input unit 16 is an interface for inputting information related to operations of a UI (user interface), which is output from the mechanism simulation unit 2.

The mechanism simulation unit 2 comprises: a paper location computing unit 20; a synchronization signal input unit 21; a UI information output unit 22; an output I/F unit 27; a UI unit 28; and an input I/F unit 29.

The paper location computing unit 20 is a module that calculates a conveying speed on a paper conveyance path based on control information regarding the motor, the clutches and the flappers which are associated with paper conveyance control, and which computes a front edge location and a rear edge location of a sheet of paper. The paper location computing unit 20 may be called as a paper location computing unit or a paper location calculation unit.

The synchronization signal input unit 21 is an interface for inputting synchronization signals output from the software simulation unit 1. The paper location computing unit 20 calculates a paper location and the like according to these synchronization signals. The UI information output unit 22 is an interface that outputs information related to synchronization signals, among information input from the UI unit 28, to the software simulation unit 1.

The output I/F unit 27 is an interface that outputs paper location information set by the front stage paper location computing unit 20 to the input I/F unit 12 of the software simulation unit 1.

The UI unit 28 creates display data for displaying a paper conveyance simulation screen based on respective information on the front edge location and the rear edge location of a sheet of paper, as calculated by the front stage paper location computing unit 20, and outputs the display data to the display control unit 5. In addition, the UI unit 28 receives information input via the operating unit 207 and the input monitoring unit 4, and transfers the information to the paper location computing unit 20 or the UI information output unit 22.

The input I/F unit 29 is an interface for receiving information output from the output I/F unit 13 of the software simulation unit 1. For instance, the input I/F unit 29 transfers control information regarding respective devices related to paper conveyance control, such as the motor, the clutches and the flappers, to subsequent stages.

Figure 4:
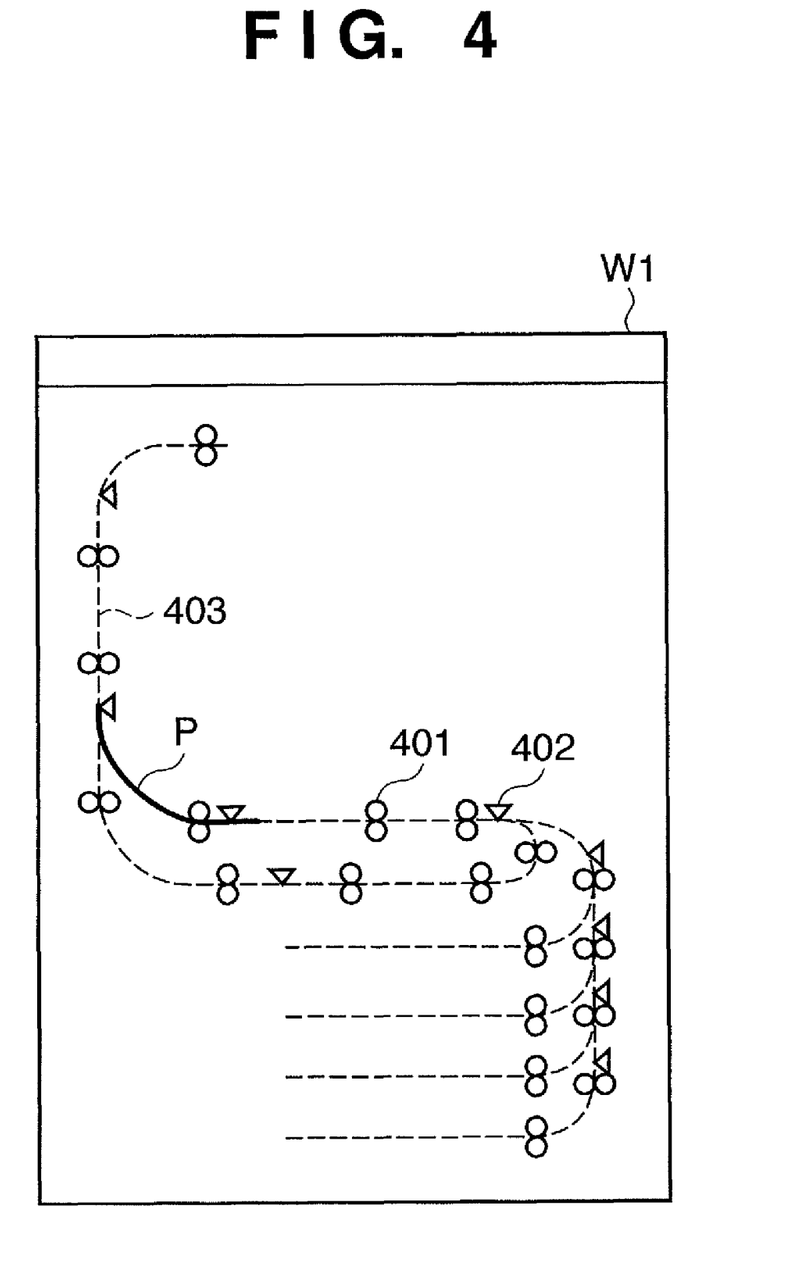
FIG. 4 is a diagram showing an example of a conveyance simulation window displayed on a display apparatus 206.

FIG. 4 is a diagram showing an example of a conveyance simulation window displayed on the display apparatus 206. A window W1 is a reproduction of a cross section of a conveyance mechanism of an image forming apparatus. Reference numeral 401 denotes a conveyance roller that conveys a paper sheet P. Reference numeral 402 denotes a sheet sensor that detects the front edge and the rear edge of the paper sheet. A dashed line 403 shown in the diagram indicates a paper conveyance path. It is assumed that various data necessary for performing a simulation, such as the number and positions of conveyance rollers 401, the number and positions of sheet sensors, and the length and shape of conveyance paths, are stored in the HDD 204.

Figure 5:
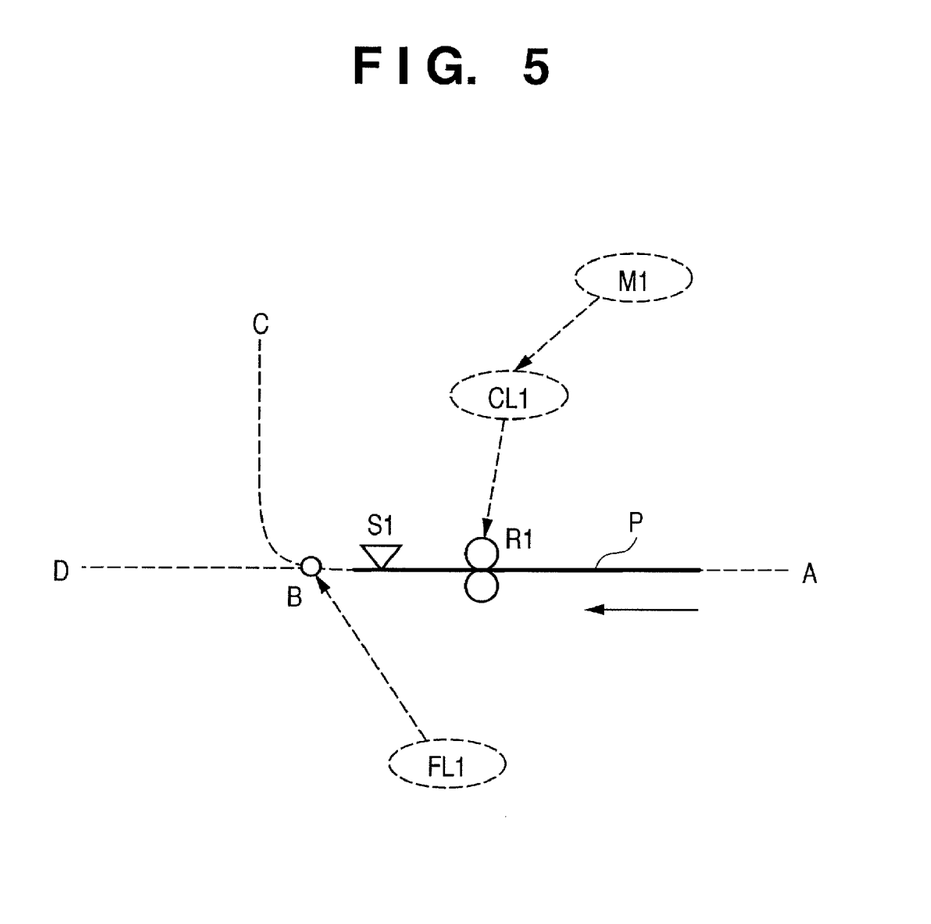
FIG. 5 is an explanatory diagram of a simulation operation.

FIG. 5 is an explanatory diagram of a simulation operation. Particularly, FIG. 5 shows an array of the respective devices related to paper conveyance control. The paper P is conveyed by a roller R1 on a conveyance path AB in the direction indicated by the solid arrow. Power is transmitted to the roller R1 from a motor M1 via a clutch CL1. When a sheet sensor S1 that is disposed downstream in the conveyance direction with respect to the roller R1 detects the front edge of the paper P, a flapper FL1 is switched. The flapper FL1 may be selectively switched between conveyance paths BC and BD.

When the input monitoring unit 4 detects that a designer has instructed commencement of a paper conveyance simulation through the operating unit 207, the CPU 201 activates the software simulation unit 1 and the mechanism simulation unit 2. While the respective modules are described hereinafter as operating entities, it should be obvious that the CPU 201 will be the actual operating entity when the respective modules are realized by software.

When the software simulation unit 1 is activated, the firmware unit 10 collaborates with the synchronization unit 11 to sequentially execute software that performs paper conveyance control of a real-life image forming apparatus.

The firmware unit 10 outputs a command required to commence rotation of the motor M1 to the input I/F unit 23 of the mechanism simulation unit 2 via the output I/F unit 12. The contents of the command include, for instance, an ID that identifies the motor M1, a rotational velocity and a rotational direction. The input I/F unit 23 hands over the input command to the paper location computing unit 20.

The paper location computing unit 20 commences rotation of the motor M1. The paper location computing unit 20 searches and extracts rollers and clutches to which driving force is applied by the motor M1 from information stored in the HDD 204. The paper location computing unit 20 subsequently calculates rotational velocities and rotational directions of the extracted rollers and clutches based on the contents of the command. For instance, a driving force is applied by the motor M1 to the roller R1 via the clutch CL1. Accordingly, the paper location computing unit 20 calculates the rotational velocity and the rotational direction of the roller R1 based on ON/OFF information of the clutch CL1.

The paper location computing unit 20 calculates, for instance, a front edge location and a rear edge location of the paper sheet P per a predetermined time interval "t". First, from the HDD 204, the paper location computing unit 20 reads out information regarding a conveyance path AB that includes the paper sheet P from the front edge to the rear edge thereof. The conveyance path information includes, for instance, IDs that identify rollers in the respective conveyance paths, and position information thereof.

In addition, the paper location computing unit 20 searches for rollers from the front edge location of the paper sheet P towards the rear edge location thereof. Based on the ID of the roller R1 initially discovered, the paper location computing unit 20 extracts information regarding the roller R1 from the HDD 204, and calculates a velocity "v" of the roller R1.

Based on the velocity "v" and the time interval "t", the paper location computing unit 20 calculates a distance S=v×t over which the paper sheet P travels during "t". Accordingly, the paper location computing unit 20 updates the current location information of the paper sheet P. It is assumed that information necessary for operation, such as current location information, is stored in the RAM 203.

The paper location computing unit 20 hands over the updated location information to the UI unit 28. According to the received location information regarding the paper sheet P, the UI unit 28 creates display data that enables the paper sheet P to be displayed at a corresponding location on the paper conveyance simulation window W1. The display control unit 5 receives display data from the UI unit 28, and causes the paper conveyance simulation window W1 to be displayed on the display apparatus 206.

Path information stored in the HDD 204 also includes IDs of sheet sensors disposed in the respective conveyance paths, as well as position information thereof. The paper location computing unit 20 searches for sheet sensors disposed in the respective conveyance paths from the front edge location of the paper sheet P towards the rear edge location thereof. The paper location computing unit 20 sends ON information for an extracted sheet sensor S1 to the output I/F unit 27. In addition, when the rear edge of the paper sheet P passes the sheet sensor S1, the paper location computing unit 20 outputs OFF information for the sheet sensor S1 to the output I/F unit 27. The output I/F unit 27 converts the ON information or the OFF information of the sheet sensor S1 into a command, and outputs the command to the input I/F unit 12 of the software simulation unit 1.

The firmware unit 10 receives the ON information for the sheet sensor S1 from the input I/F unit 12, and commences control of the flapper FL1. Substantially similar to the case of the motor M1, the firmware unit 10 sends a command to the mechanism simulation unit 2 for switching the flapper FL1.

Upon receiving this command, the paper location computing unit 20 awaits arrival of the front edge of the paper P at a branch point B. When the sheet sensor S1 detects the front edge through simulation, the paper location computing unit 20 determines a conveyance path through which the paper sheet P should next proceed. For instance, the conveyance path is determined based on a switched state of the pre-set flapper FL1 that is preset as a simulation condition. In this example, the direction of travel of the paper sheet P is either the conveyance path BC or the conveyance path BD.

The time interval "t", described herein, is managed by the synchronization unit 11. The paper location computing unit 20 receives a synchronization signal from the synchronization unit 11 via the synchronization signal output unit 15 and the synchronization signal input unit 21, and according to the received synchronization signal, executes various simulation operations.

Figure 6A:
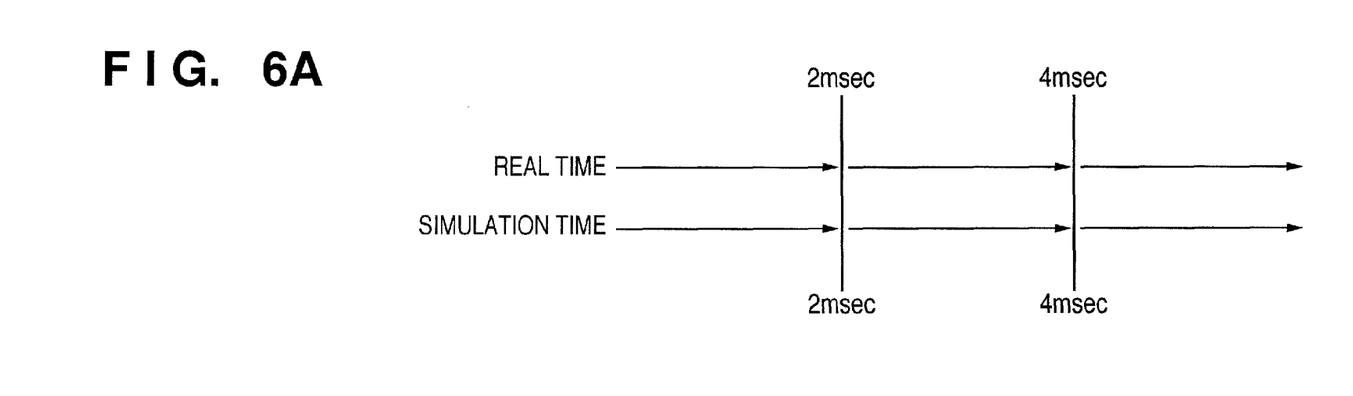
FIG. 6A is a diagram showing a relationship between simulation time and real time during a normal (low-speed) mode.
Figure 6B:
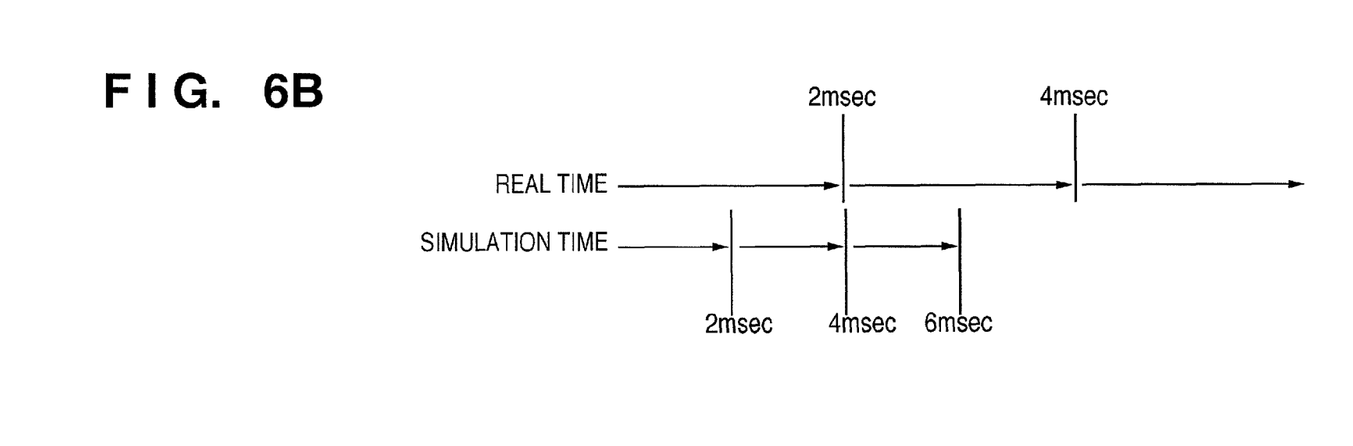
FIG. 6B is a diagram showing a relationship between simulation time and real time during a high-speed mode.

FIGS. 6A and 6B are diagrams describing a difference between simulation times of the respective simulation modes. More specifically, FIG. 6A shows a relationship between simulation time and real time during the normal mode. FIG. 6B shows a relationship between simulation time and real time during the high-speed mode. The simulation speed during normal mode is slower than that during the high-speed mode. Therefore, the normal mode may be referred to as the low-speed mode.

As shown in FIG. 6A, in the normal mode, simulation time coincides with real time. The synchronization unit 11 monitors the state of the firmware unit 10, and also adjusts a synchronization signal so that real time equals simulation time. More specifically, even when operations that should be completed within 2 msec are completed in reality, the firmware unit 10 does not advance simulation time by 2 msec unless 2 msec of real time has elapsed. The synchronization unit 11 advances simulation time by 2 msec when 2 msec of real time elapses, and sends a corresponding synchronization signal from the synchronization signal output unit 15. This enables simulation time and real time to coincide with each other.

As shown in FIG. 6B, in the high-speed mode, simulation time progresses independently of real time. This is because the synchronization unit 11 monitors the state of the firmware unit 10, and adjusts transmission of synchronization signals so that simulation time progresses at a highest possible rate. More specifically, when an operation that should be completed within 2 msec is completed in reality, the firmware unit 10 immediately advances simulation time by 2 msec. This enables simulation time to progress at a faster rate than real time. As a result, speeding up of simulation operations is achieved.

As seen, by having at least two simulation modes, the simulator apparatus according to the present embodiment is capable of using the respective modes according to the intended purpose of simulations.

Figure 7A:
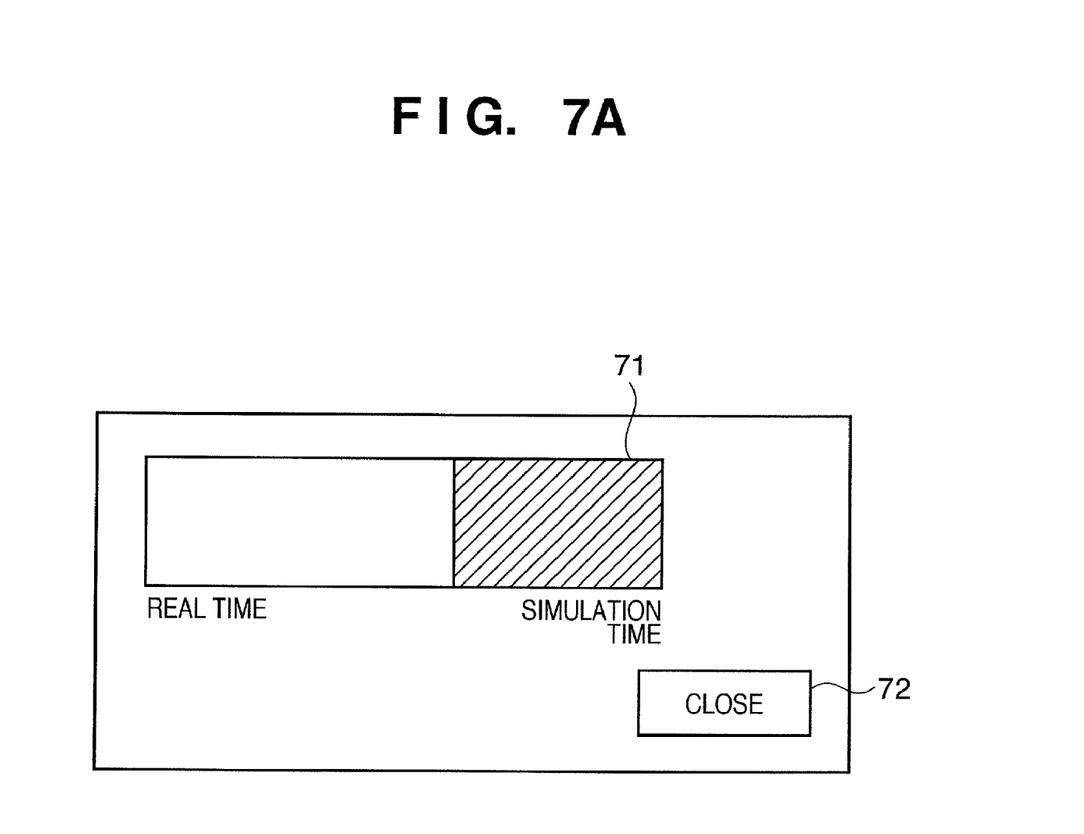
FIG. 7A is a diagram showing an example of a settings window for selectively switching between a normal mode and a high-speed mode according to the embodiment.

FIG. 7A is a diagram showing an example of a simulation mode selection mechanism according to the present embodiment. More specifically, FIG. 7A shows an example of a basic settings window. The basic settings window is displayed on the display apparatus 206 under the control of the display control unit. A mode setting lever 71 slides to either left or right according to a clicking operation of the operating unit 207. When the mode setting lever 71 is slid to the right-hand side, the input monitoring unit 4 acknowledges that the high-speed mode has been selected. When the mode setting lever 71 is slid to the left-hand side, the input monitoring unit 4 acknowledges that the normal mode has been selected.

At this point, information regarding the movement of the lever 71 is received by the synchronization unit 11 via the input monitoring unit 4, the UI unit 28, the UI information output unit 22 and the U1 information input unit 16. According to the received information, the synchronization unit 11 identifies the selected simulation mode, and adjusts the transmission timing of synchronization signals so that the identified mode is realized. The UI unit 28 also displays the basic settings window during a simulation operation when a specific operation is input via the operating unit 207. In other words, simulation modes may be switched even during simulation operations.

Figure 7B:
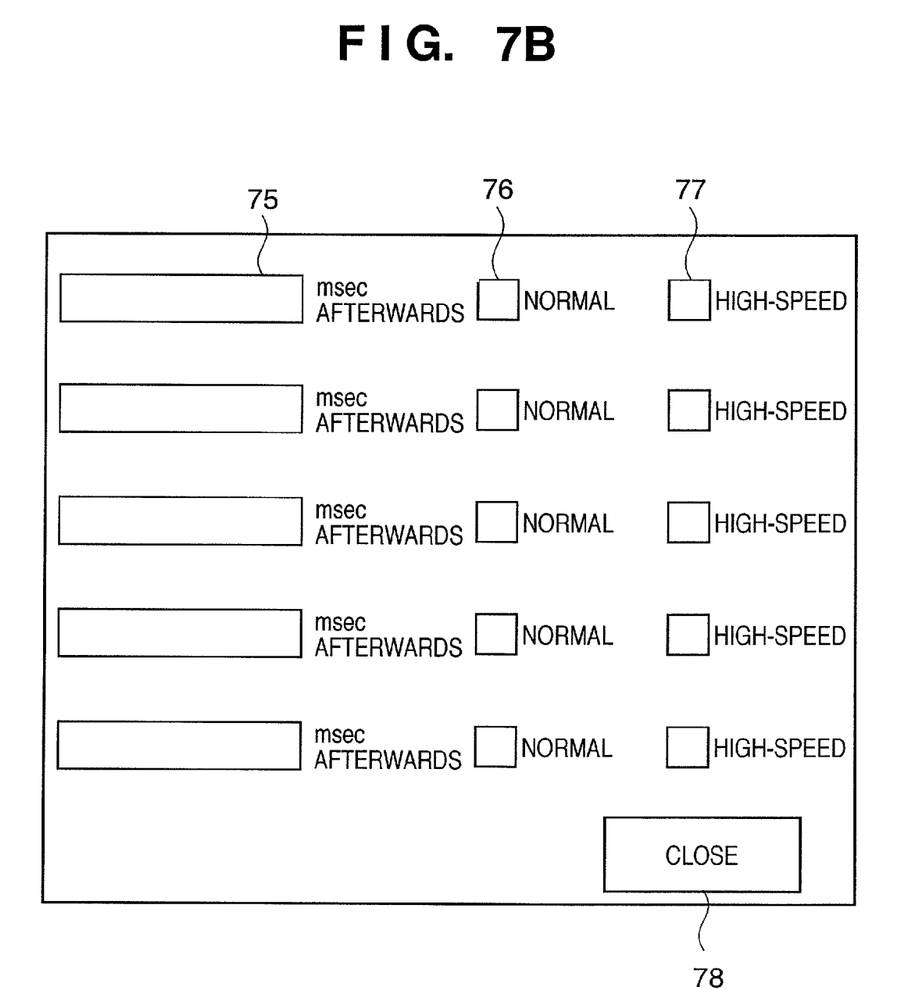
FIG. 7B is a diagram showing an example of a sequential settings window according to the embodiment.

While the high-speed mode and the normal mode are exemplified in FIG. 7B, three or more simulation modes may be prepared instead. In addition, specific simulation speeds may be arranged to be input from the basic settings window.

FIG. 7B is a diagram showing an example of a sequential settings window according to the present embodiment. A text box 75 is a text box for inputting time data to be used as a switching timing for simulation modes. The time data may either be clock time or the time elapsed since simulation commencement. Reference numeral 76 denotes a check box for selecting the normal mode. Reference numeral 77 denotes a check box for selecting the high-speed mode. The check boxes 76 and 77 are arranged to be alternatively selectable. Therefore, the check boxes 76 and 77 may instead be realized as a radio button.

A close button 78 is a button used for reflecting a switching timing or a mode set by the text box 75 or the check box 76 onto a simulation. In the settings window shown in FIG. 7B, one or more timings for switching simulation speeds may be designated. In addition, a simulation speed or a simulation mode corresponding to the designated timing may be designated.

When the input monitoring unit 4 detects that the close button 78 has been pressed, the UI unit 28 transmits information regarding the designated switching timing and mode to the synchronization unit 11 via the UI information output unit 22 and the UI information input unit 16. The synchronization unit 11 adjusts synchronization signals so that the simulation mode is switched to the designated simulation mode upon arrival of the designated timing. As seen, according to the present embodiment, a user such as a designer will now be able to arbitrarily designate a switching timing, as well as a simulation mode subsequent to the switching.

Figure 8:
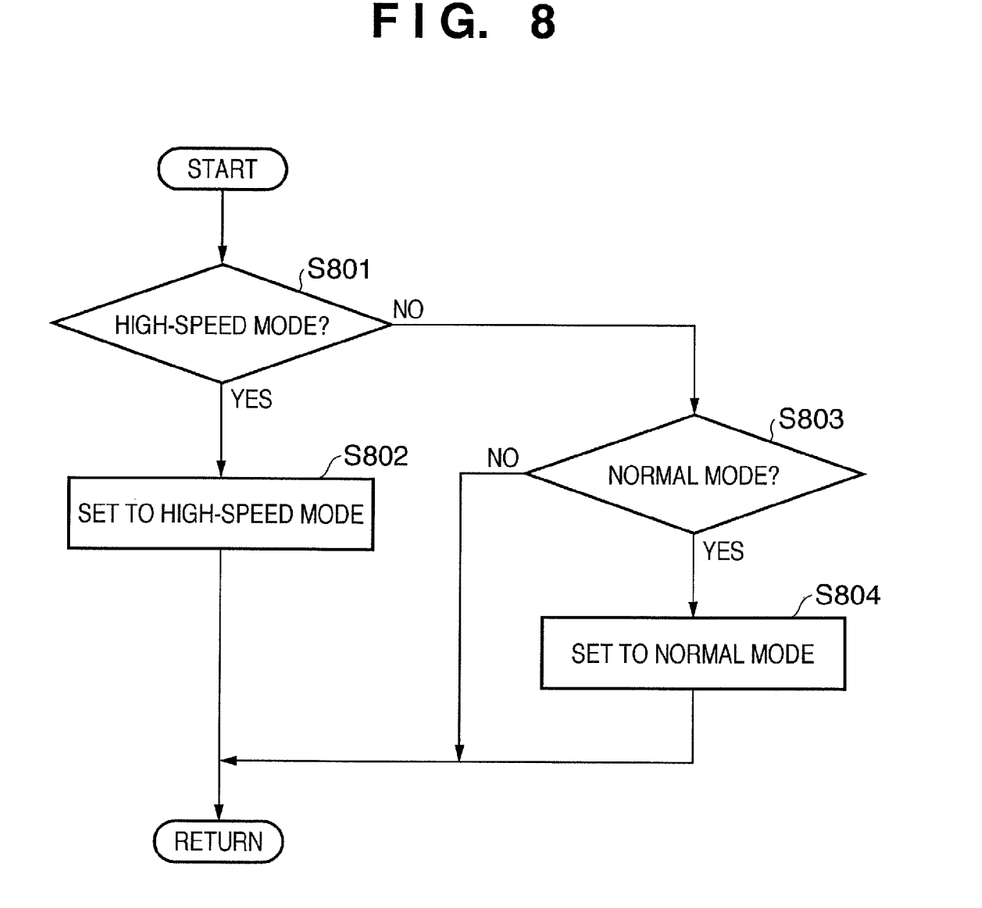
FIG. 8 is a flowchart showing an example of a setting change sequence of simulation modes according to the embodiment.

FIG. 8 is a flowchart showing an example of a setting change sequence of simulation modes according to the present embodiment. More specifically, the flowchart is related to a part of processing performed by the synchronization unit 11. The sequence is commenced upon activation of the simulation program, and is executed concurrently with other processing.

In step S801, the CPU 201 that realizes the synchronization unit 11 determines whether information for initiating the high-speed mode has been received from the operating unit 207. In this case, the information for setting the high-speed mode is transmitted from the UI unit 28 when the lever 71 shown in FIG. 7A is slid from the normal mode to the high-speed mode. It should be obvious that this information includes information indicating that the high-speed mode has been selected.

When the high-speed mode is selected, the processing proceeds to step S802 where the CPU 201 changes the simulation mode to the high-speed mode. As described above, the synchronization unit 11 executes transmission processing of a synchronization signal as well as other processing necessary for realizing the high-speed mode.

On the other hand, if the high-speed mode has not been selected, the processing proceeds to step S803 where the CPU 201 determines whether information for setting the normal mode has been received. The information for setting the normal mode is transmitted from the UI unit 28 when the lever 71 shown in FIG. 7A is slid from the high-speed mode to the normal mode. It should be obvious that this information includes information indicating that the normal mode has been selected.

When information for initiating the normal mode is received, the processing proceeds to step S804 where the CPU 201 changes the simulation mode to the normal mode. As described above, the synchronization unit 11 executes transmission processing of a synchronization signal as well as other processing necessary for realizing the normal mode. On the other hand, if information for setting the normal mode has not been received, the CPU 201 temporarily concludes the processing of the present flowchart, and executes the respective steps starting with the step S801 again.

Although a simulation mode default value has not been described, the default value may, for instance, be the normal mode.

Figure 9:
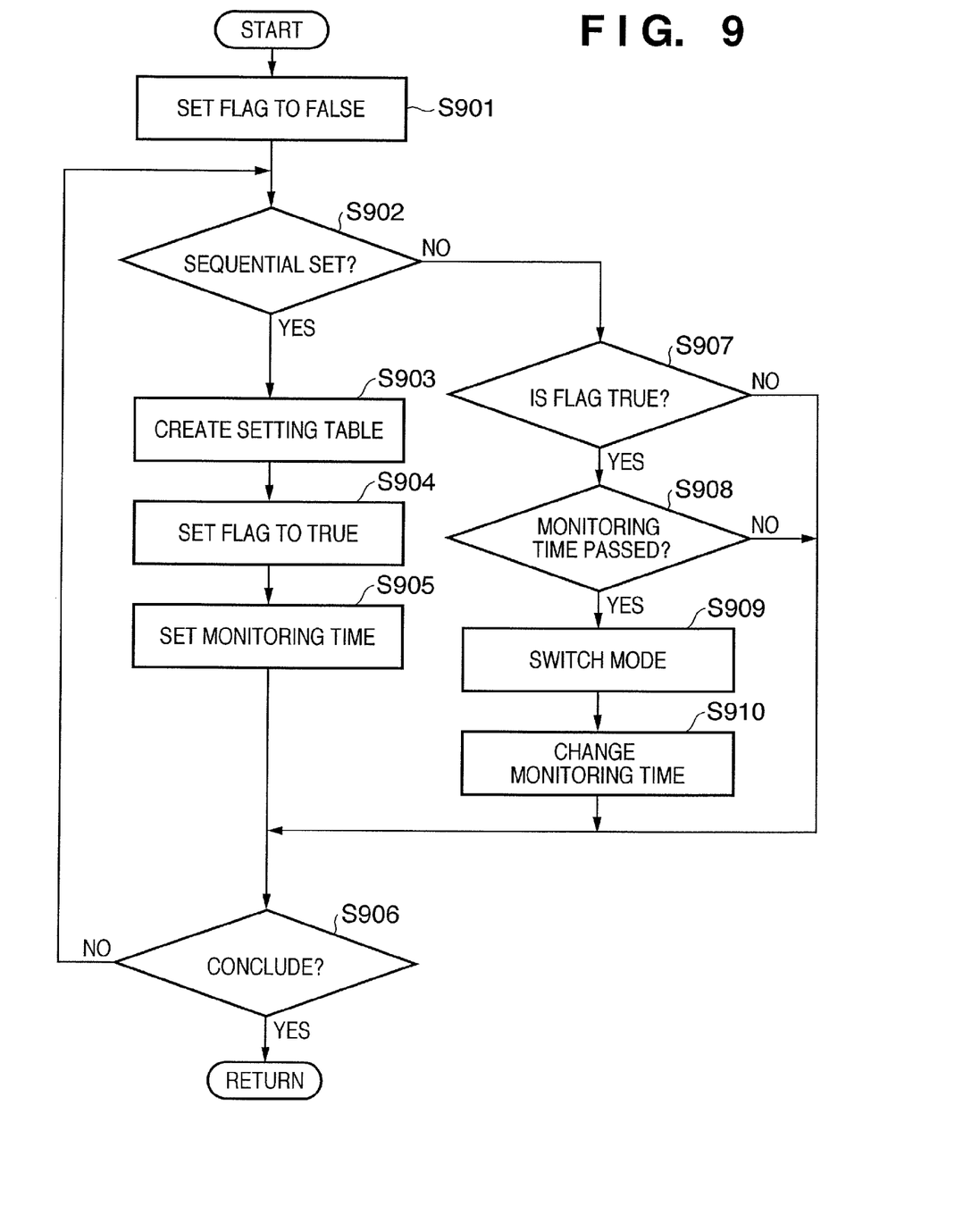
FIG. 9 is a flowchart showing an example of a sequential setting sequence according to the embodiment.

FIG. 9 is a flowchart showing an example of a sequential setting sequence according to the present embodiment. Sequential setting refers to processing for setting one or more switching timings and corresponding simulation modes using the window shown in FIG. 7B. While this sequence is also a part of processing performed by the synchronization unit 11, the sequence will be described hereunder under the assumption that the sequence is executed by the CPU 201. It is also assumed that the sequence is commenced upon activation of the simulation program, and is executed concurrently with other processing.

In step S901, the CPU 201 sets a reception flag stored in the RAM 203 to FALSE. This reception flag is used in a subsequent step in order to determine whether sequential setting information has been received. As described using FIG. 7B, sequential setting information is information used for setting one or more switching timings and corresponding simulation modes.

In step S902, the CPU 201 determines whether sequential setting information has been received. If so, the processing proceeds to step S903 where the CPU 201 creates a setting table based on the sequential setting information. Timings input using the window shown in FIG. 7B are sorted in a sequence beginning with a timing that is nearest to the current time and registered in the setting table. It should be obvious that mode selection information corresponding to the timings is sorted together with the timings. It is assumed that the setting table is stored in the RAM 203.

In step S904, the CPU 201 changes the reception flag to TRUE. The sequence of steps S903 and S904 may be reversed. The respective steps in the present embodiment are not limited to the sequences shown in the drawings, and the sequences may be arbitrarily changed as long as similar results may be obtained.

In step S905, the CPU 201 reads out the created setting table, and through comparison with the current time, identifies a timing that is yet to pass and is closest to the current time, and monitors the identified timing as a monitoring time. The monitoring time is monitored using a timer built into the CPU 201.

In step S906, the CPU 201 determines whether the simulation should be concluded. For instance, it is determined that the simulation should be concluded when, for example, the simulation has been completely concluded, or when a conclusion instruction has been issued by interrupt processing. If the simulation should not be concluded, the processing returns to step S902.

In step S902, if sequential setting information has not been received, the processing proceeds to step S907. In step S907, the CPU 201 reads out the flag from the RAM 203 and determines whether the flag is set to TRUE. If the flag is not TRUE, the processing proceeds to step S906.

On the other hand, if the flag is TRUE, the processing proceeds to step S908. In step S908, the CPU 201 references the timer and determines whether the set monitoring time has passed. If the set monitoring time has not yet arrived, the processing proceeds to step S906.

On the other hand, if the set monitoring time has passed, the processing proceeds to step S909 where the CPU 201 reads out the setting table from the RAM 203, and identifies a simulation mode corresponding to the present monitoring time from the setting table. The CPU 201 subsequently issues a switching command for changing the mode to the identified simulation mode (the normal mode or the high-speed mode). The setting processing shown in FIG. 8 will be executed according to the switching command.

In step S910, the CPU 201 reads out the setting table, identifies a next monitoring time succeeding the current monitoring time that was presently determined as passed, and sets the identified next monitoring time as a monitoring target. The processing subsequently proceeds to step S906.

Figure 10:
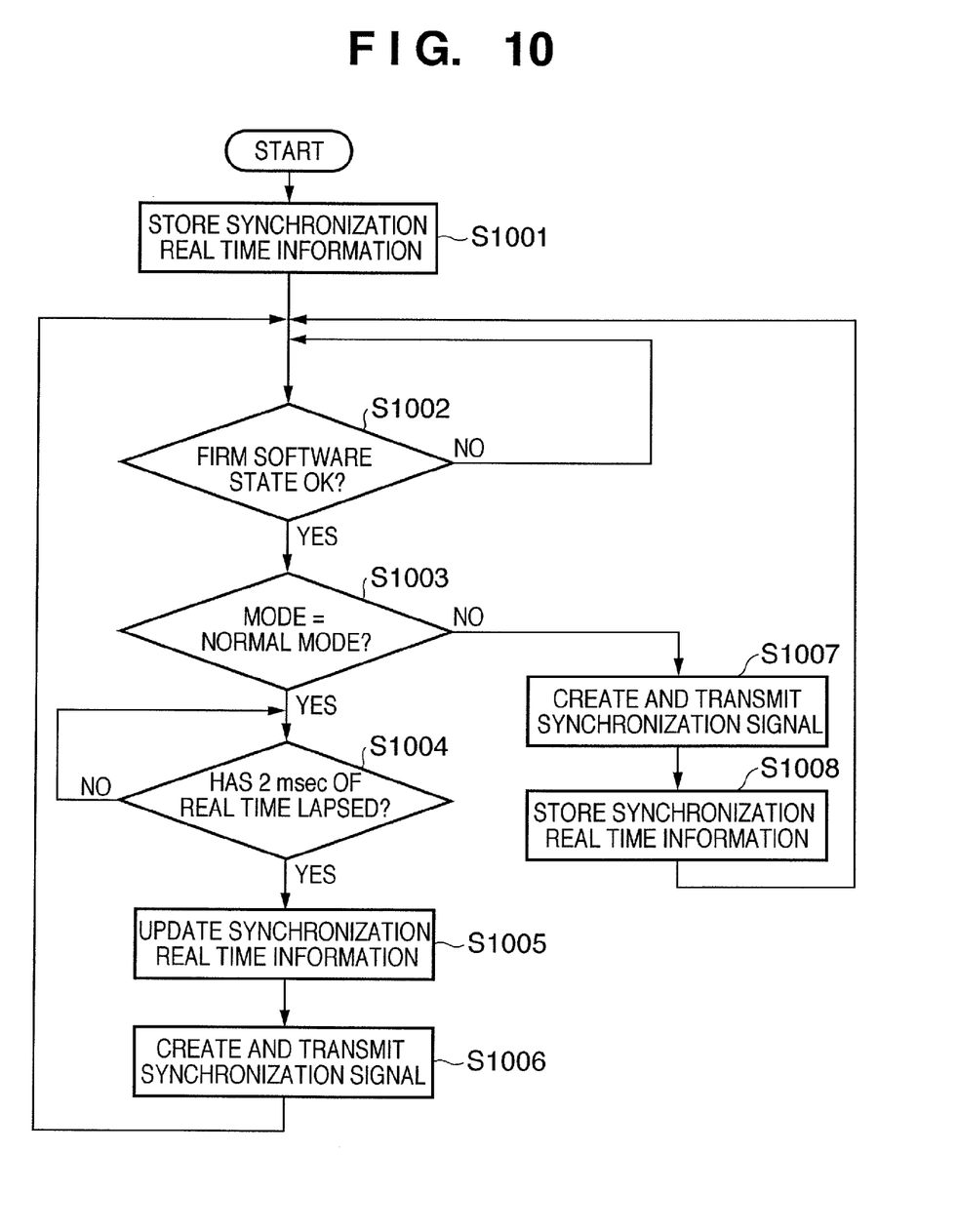
FIG. 10 is a flowchart showing an example of a simulation mode switching sequence according to the embodiment.

FIG. 10 is a flowchart showing an example of a simulation mode switching sequence according to the present embodiment. While this sequence is also a part of processing performed by the synchronization unit 11, the sequence will be described hereunder under the assumption that the sequence is executed by the CPU 201. It is also assumed that the sequence is commenced upon activation of the simulation program, and is executed concurrently with other processing.

In step S1001, the CPU 201 stores real time information for synchronization in the RAM 203. For instance, real time information refers to information from which real time is identifiable, such as a count of the clock of the CPU 201 at that precise moment. The real time information is used in a subsequent step for adjusting the relationship between simulation time and real time.

In step S1002, the CPU 201 determines whether the firmware unit 10 is already in a state where transmission of a synchronization signal to the mechanism simulation unit 2 is possible. After standing by until transmission of a synchronization signal becomes possible, the CPU 201 proceeds to step S1003. A state where transmission of a synchronization signal is possible is, for instance, a state where the main sequence itself of the firm software has not yet been activated.

In step S1003, the CPU 201 determines whether the simulation mode is set to the normal mode. If not (i.e., if the high-speed mode has been set), the processing proceeds to step S1007. In step S1007, the CPU 201 generates a synchronization signal from the real time information for synchronization, and transmits the synchronization signal to the paper location computing unit 20 of the mechanism simulation unit 2 via the synchronization signal output unit 15 and the synchronization signal input unit 21. In step S1008, the CPU 201 stores real time information for synchronization in the RAM 203, and returns to step S1002. As seen, during high-speed mode, since a synchronization signal is output without awaiting a predetermined real time, the simulation will be performed at high speed. In the high-speed mode, real time that is relatively shorter than a predetermined real time (e.g., 2 msec) during the normal mode may also be used as a standby time.

On the other hand, if the simulation mode is set to the normal mode, the processing proceeds to step S1004. In step S1004, the CPU 201 compares the time included in the synchronization real time information with the current simulation time, and determines whether the current simulation time converted into real time has equaled or passed a predetermined time (e.g., 2 msec). The CPU 201 waits for the predetermined time to pass, and proceeds to step S1005.

In step S1005, the CPU 201 updates the real time information by adding the above-mentioned predetermined time to the real time information for synchronization stored in the RAM 203. In step S1006, the CPU 201 generates a synchronization signal corresponding to the updated real time information for synchronization, transmits the generated synchronization signal to the paper location computing unit 20 of the mechanism simulation unit 2 via the synchronization signal output unit 15 and the synchronization signal input unit 21, and returns to step S1002.

As described above, according to the present embodiment, since simulation speeds will also become selectable according to the intended purpose of verification, verification of the behavior of an image forming apparatus may be performed more efficiently than with conventional arrangements.

As for simulation speeds, while a specific value may be designated, it is conceivable that enabling a user to select a simulation mode from a plurality of prepared simulation modes (e.g., high-speed mode or low-speed mode) will be more user-friendly.

The simulation computing unit 3 may perform a simulation operation of the behavior of the image forming apparatus with a first accuracy when the high-speed mode is selected. In addition, the simulation computing unit 3 may perform a simulation operation of the behavior of the image forming apparatus with a second accuracy that is higher than the first accuracy when the low-speed mode is selected. Particularly, since the low-speed mode allows more time to spare in comparison to the high-speed mode, complicated operations may be executed from which a relatively high accuracy may be expected. Furthermore, the CPU 201 according to the present embodiment may be arranged to receive input for selecting either the high-speed mode or the low-speed mode even before or during execution of a simulation operation by the simulation computing unit 3. For instance, assume that a designer desires to perform detailed verification on a behavioral state after a lapse of an extended period of time (for instance, the behavioral state during printing of an 101st page). In this case, it is possible to perform high-speed operation up to a point slightly before the time to be verified, and reduce the operation speed at the time to be verified to perform detailed analysis. As a result, verification efficiency may be improved.

Moreover, by collaborating with the operating unit 207 or the display apparatus 206, the CPU 201, according to the present embodiment, is capable of designating one or more timings at which the simulation speed is switched, as well as a simulation speed or a simulation mode corresponding to the designated timings (FIG. 7B). Therefore, a designer will be able to verify the behavior of an image forming apparatus while switching simulation modes at desired timings.

In addition, by utilizing the simulation apparatus or the simulation program according to the present embodiment, design of image forming apparatuses may be supported in an efficient manner.

Other Embodiments

While various embodiments have been described in detail above, the present invention may be applied to either a system composed of a plurality of devices, or an apparatus consisting of a single device.

The present invention may also be achieved by directly or remotely supplying a software program which implements the respective functions of the above-described embodiments to a system or an apparatus, and reading out and executing supplied program codes by a computer of the system or the like.

Therefore, the program codes themselves, to be installed on the computer in order to achieve the functions and processing of the present invention through the computer, may also achieve the present invention. In other words, the computer programs themselves for achieving the functions and processing described above are also implementations of the present invention.

In such cases, as long as program functions are retained, the program may take any form, including object code, an interpreter-executable program, or script data supplied to an OS.

Recording media for supplying the program may include, for instance, a flexible disk, a hard disk, an optical disk, a magneto-optical disk, an MO, a CD-RON, a CD-R, or a CD-RW. In addition, recording media may include a magnetic tape, a nonvolatile memory card, a ROM, a DVD (DVD-ROM, DVD-R) or the like.

Furthermore, the program may be downloaded using a browser of a client computer from an Internet home page. In other words, the computer program itself of the present invention or a compressed file having an auto-install function may be downloaded from the homepage to a recording medium such as a hard disk. In addition, the present invention may also be achieved by dividing the program code which configures the program of the present invention into a plurality of files, and downloading each file from a different home page. In other words, there may be cases where a WWW server, which allows downloading of program files for achieving the functions and processing of the present invention on a computer by a plurality of users, also becomes a component of the present invention.

Furthermore, the program according to the present invention may be encoded and stored in a storage medium such as a CD-ROM to be distributed to users. In this case, only users who satisfy certain conditions may be allowed to download key information for decoding from a home page via the Internet, whereby the key information may be used to decode and execute the encoded program, and to install the same on a computer.

Moreover, the functions of the above-described embodiments may also be achieved by executing a read out program by a computer. An OS or the like running on the computer may perform a portion of or all of the actual processing based on instructions from the program. It should be obvious that the functions of the above-described embodiments may also be achieved in this case.

In addition, a program that is read out from the recording medium may be written into a memory provided on a function extension board inserted into a computer or a function extension unit connected to the computer. A CPU or the like provided on the function extension board or the function extension unit may perform a portion of or all of the actual processing based on instructions of the program. The functions of the above-described embodiments may also be achieved in this manner.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. This application claims the benefit of Japanese Patent Application No. 2006-159137, filed Jun. 7, 2006 hereby incorporated by reference herein in its entirety.

What is claimed is:

1. A simulator apparatus which simulates a behavior of an image forming apparatus in order to verify the behavior, comprising:
    a CPU;
    a computing unit which performs a sheet conveying simulation operation of the behavior of said image forming apparatus; and
    a selection unit which selects one of a high-speed mode and a low-speed mode in accordance with a designation from a user,
    wherein said computing unit executes the high-speed mode in which the sheet conveying simulation operation is performed at a first simulation speed and the low-speed mode in which the sheet conveying simulation operation is performed at a second simulation speed that is slower than the first simulation speed,
    wherein when the selection unit selects the low-speed mode, the computing unit outputs a synchronization signal when a particular predetermined real time interval has elapsed to enable simulation time and real time to coincide with each other,
    wherein when the selection unit selects the high-speed mode, the computing unit outputs the synchronization signal without awaiting any predetermined real time interval to enable the simulation time to progress independently of real time, wherein the selection unit makes the user select (a) a timing at which a mode of the simulation operation is switched and (b) one of the high-speed mode and the low-speed mode to be switched to at the selected timing, wherein said selection unit includes a reception unit which receives input for selecting the high-speed mode or the low-speed mode even before or during execution of the sheet conveying simulation operation by said computing unit, wherein the selection unit populates a table with information comprising the user-selected timing and mode to be switched, wherein the selection unit sets a reception flag to true in response to reception of the user-selected timing and mode to be switched, and wherein the computing unit is implemented at least in part by the CPU.

2. The simulator apparatus according to claim 1, wherein said computing unit includes:

a first simulation computing unit which performs the sheet conveying simulation operation on the behavior of said image forming apparatus with a first accuracy when the high-speed mode is selected; and a second simulation computing unit which performs the sheet conveying simulation operation on the behavior of said image forming apparatus with a second accuracy that is higher than the first accuracy when the low-speed mode is selected.

3. The simulator apparatus according to claim 1, wherein said selection unit includes:

a first designation unit which designates one or more timings at which the simulation speed of said computing unit is switched; and a second designation unit which designates a simulation speed or a simulation mode corresponding to the designated timing.

4. A design support method comprising the step of: supporting design of an image forming apparatus using the simulator apparatus according to claim 1.

5. A simulation method for simulating a behavior of an image forming apparatus in order to verify the behavior, the method implemented by a simulator apparatus comprising a computing unit and a selection unit, and the method comprising:

a selection step of selecting one of a high-speed mode and a low-speed mode in accordance with a designation from a user for simulating the behavior of said image forming apparatus, the selection step executed by the selection unit; and a computing step of performing a sheet conveying simulation operation according to the selected high-speed mode or low-speed mode, the computing step executed by the computing unit, wherein said computing step executes the high-speed mode in which the sheet conveying simulation operation is performed at a first simulation speed and the low-speed mode in which the sheet conveying simulation operation is performed at a second simulation speed that is slower than the first simulation speed, wherein when the selection step selects the low-speed mode, the computing step outputs a synchronization signal when a particular predetermined real time interval has elapsed to enable simulation time and real time to coincide with each other, wherein when the selection step selects the high-speed mode, the computing step outputs the synchronization signal without awaiting any predetermined real time interval to enable the simulation time to progress independently of real time, wherein the selection step makes the user select (a) a timing at which a mode of the simulation operation is switched and (b) one of the high-speed mode and the low-speed mode to be switched to at the selected timing, wherein said selection unit includes a reception unit which receives input for selecting the high-speed mode or the low-speed mode even before or during execution of the sheet conveying simulation operation by said computing unit, wherein the selection unit populates a table with information comprising the user-selected timing and mode to be switched, and wherein the selection unit sets a reception flag to true in response to reception of the user-selected timing and mode to be switched.

6. A non-transitory computer-readable recording medium storing a computer program that when executed by a computer causes the computer to perform a simulation method for simulating a behavior of an image forming apparatus in order to verify the behavior, wherein the method comprises:

a selection step of selecting one of a high-speed mode and a low-speed mode in accordance with a designation from a user for simulating the behavior of said image forming apparatus; and a computing step of performing a sheet conveying simulation operation according to the selected high-speed mode or low-speed mode, wherein said computing step executes the high-speed mode in which the sheet conveying simulation operation is performed at a first simulation speed and the low-speed mode in which the sheet conveying simulation operation is performed at a second simulation speed that is slower than the first simulation speed, wherein when the selection step selects the low-speed mode, the computing step outputs a synchronization signal when a particular predetermined real time interval has elapsed to enable simulation time and real time to coincide with each other, and wherein when the selection step selects the high-speed mode, the computing step outputs the synchronization signal without awaiting any predetermined real time interval to enable the simulation time to progress independently of real time wherein the selection step makes the user select (a) a timing at which a mode of the simulation operation is switched and (b) one of the high-speed mode and the low-speed mode to be switched to at the selected timing, wherein said selection unit includes a reception unit which receives input for selecting the high-speed mode or the low-speed mode even before or during execution of the sheet conveying simulation operation by said computing unit, wherein the selection unit populates a table with information comprising the user-selected timing and mode to be switched, and wherein the selection unit sets a reception flag to true in response to reception of the user-selected timing and mode to be switched.

* * * * *